United States Patent
Takiguchi et al.

(10) Patent No.: US 10,808,103 B2
(45) Date of Patent: Oct. 20, 2020

(54) RESIN COMPOSITION, LAMINATE INCLUDING THE RESIN COMPOSITION, SEMICONDUCTOR WAFER WITH RESIN COMPOSITION LAYER, SUBSTRATE FOR MOUNTING SEMICONDUCTOR WITH RESIN COMPOSITION LAYER, AND SEMICONDUCTOR DEVICE INCLUDING THE SEMICONDUCTOR WAFER WITH RESIN COMPOSITION LAYER

(71) Applicant: MITSUBISHI GAS CHEMICAL COMPANY, INC., Tokyo (JP)

(72) Inventors: Takenori Takiguchi, Tokyo (JP); Kohei Higashiguchi, Tokyo (JP); Tsuyoshi Kida, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 47 days.

(21) Appl. No.: 16/304,908

(22) PCT Filed: May 29, 2017

(86) PCT No.: PCT/JP2017/019905
§ 371 (c)(1),
(2) Date: Nov. 27, 2018

(87) PCT Pub. No.: WO2017/209043
PCT Pub. Date: Dec. 7, 2017

(65) Prior Publication Data
US 2019/0300678 A1    Oct. 3, 2019

(30) Foreign Application Priority Data

May 31, 2016 (JP) ................. 2016-108171
Jul. 22, 2016 (JP) ................. 2016-144273

(51) Int. Cl.
| | |
|---|---|
| H01L 29/08 | (2006.01) |
| C08K 13/02 | (2006.01) |
| C09D 7/63 | (2018.01) |
| H01L 21/56 | (2006.01) |
| H01L 23/29 | (2006.01) |
| H01L 23/31 | (2006.01) |
| C08K 5/09 | (2006.01) |
| C08K 3/00 | (2018.01) |
| C08K 5/17 | (2006.01) |
| C08F 22/40 | (2006.01) |
| C08L 35/00 | (2006.01) |
| C08K 5/544 | (2006.01) |
| C09J 7/00 | (2018.01) |
| C09J 179/04 | (2006.01) |
| C08K 5/20 | (2006.01) |
| C08K 5/13 | (2006.01) |
| C09J 11/04 | (2006.01) |
| C09J 11/06 | (2006.01) |

(52) U.S. Cl.
CPC .............. *C08K 13/02* (2013.01); *C08F 22/40* (2013.01); *C08K 3/00* (2013.01); *C08K 5/09* (2013.01); *C08K 5/13* (2013.01); *C08K 5/17* (2013.01); *C08K 5/20* (2013.01); *C08K 5/544* (2013.01); *C08L 35/00* (2013.01); *C09D 7/63* (2018.01); *C09J 7/00* (2013.01); *C09J 11/04* (2013.01); *C09J 11/06* (2013.01); *C09J 179/04* (2013.01); *H01L 21/563* (2013.01); *H01L 23/29* (2013.01); *H01L 23/31* (2013.01)

(58) Field of Classification Search
CPC ............ C08L 39/04; C08K 3/013; C08K 3/00
USPC ....................................... 257/789
See application file for complete search history.

(56) References Cited

U.S. PATENT DOCUMENTS

| | | | | |
|---|---|---|---|---|
| 6,562,482 | B1* | 5/2003 | Sakamoto | C08G 59/628 257/789 |
| 7,897,660 | B2* | 3/2011 | Martin | C04B 24/34 524/2 |
| 2007/0155047 | A1 | 7/2007 | Jayaraman et al. | |
| 2008/0227905 | A1* | 9/2008 | Kumasaki | C08F 293/005 524/505 |
| 2010/0129676 | A1 | 5/2010 | Fujimoto et al. | |
| 2013/0026660 | A1 | 1/2013 | Czubarow et al. | |
| 2014/0014928 | A1* | 1/2014 | Okumura | G03F 7/00 257/40 |
| 2014/0242757 | A1 | 8/2014 | Yoko et al. | |

FOREIGN PATENT DOCUMENTS

| | | |
|---|---|---|
| JP | 6-157754 | 6/1994 |
| JP | 2008-291227 | 12/2008 |
| JP | 2009-001783 | 1/2009 |
| JP | 2009-35710 | 2/2009 |
| JP | 4587631 | 9/2010 |
| JP | 2013-112730 | 6/2013 |
| JP | 2014-80478 | 5/2014 |
| JP | 2014-521754 | 8/2014 |

(Continued)

OTHER PUBLICATIONS

International Preliminary Report on Patentability dated Dec. 4, 2018 for International Patent Application No. PCT/JP2017/019905.

*Primary Examiner* — Caleb E Henry
(74) *Attorney, Agent, or Firm* — Greenblum & Bernstein, P.L.C.

(57) ABSTRACT

The present invention provides a resin composition for an underfill material, comprising a maleimide compound (A) and a secondary monoamino compound (B), wherein the secondary monoamino compound (B) has a boiling point of 120° C. or more.

19 Claims, No Drawings

(56) References Cited

FOREIGN PATENT DOCUMENTS

| JP | 2015-503220 | 1/2015 |
| JP | 2016-65146 | 4/2016 |
| WO | 02/102812 | 12/2002 |

\* cited by examiner

RESIN COMPOSITION, LAMINATE INCLUDING THE RESIN COMPOSITION, SEMICONDUCTOR WAFER WITH RESIN COMPOSITION LAYER, SUBSTRATE FOR MOUNTING SEMICONDUCTOR WITH RESIN COMPOSITION LAYER, AND SEMICONDUCTOR DEVICE INCLUDING THE SEMICONDUCTOR WAFER WITH RESIN COMPOSITION LAYER

TECHNICAL FIELD

The present invention relates to a resin composition useful as an underfill material, a laminate using such a resin composition, a semiconductor wafer with a resin composition layer, a substrate for mounting a semiconductor with a resin composition layer, and a semiconductor device produced by using the resin composition of the present invention.

BACKGROUND ART

In recent years, in accordance with downsizing and improvement in performance of semiconductor devices, flip-chip bonding is attracting attention as a method for mounting a semiconductor chip (hereinafter sometimes abbreviated as a "chip") on a substrate for mounting a semiconductor (hereinafter sometimes abbreviated as "substrate"). In the flip-chip bonding, a method in which a chip and a substrate are connected to each other, and an underfill material filled in a gap between the chip and the substrate is cured is generally employed. In accordance with downsizing and improvement in performance of semiconductor devices, however, a pitch between electrodes arranged on a chip and a gap between electrodes are reduced, and hence, workability degrades due to elongated time required for filling an underfill material, or filling failure such as insufficient filling occurs, which is problematic. In order to deal with the problem, a method in which the connection between a chip and a substrate and the filling of an underfill material are simultaneously performed after supplying a pre-applied underfill material to the chip or the substrate is being examined.

Since an underfill material is a member brought into direct contact with a chip, one of significant characteristics required of an underfill material is adhesiveness to a chip (hereinafter sometimes abbreviated as "adhesion to a chip") that can stand long term use under a use environment of a semiconductor device.

Patent Literature 1 describes a pre-applied underfill material using a radically polymerizable monomer as a main resin. In this Patent Literature 1, addition of a silane coupling agent for purposes of improving adhesiveness to a chip is described.

Patent Literature 2 describes an underfill material containing an epoxy resin, an imidazole compound and a maleimide compound.

Patent Literature 3 describes a pre-applied underfill material using an epoxy compound and a carboxyl-group containing flux component, and adhesion is mentioned therein.

Patent Literature 4 describes a resin composition containing a maleimide compound, an epoxy resin and an epoxy resin curing agent as essential components, and describes that high adhesion could be obtained in the resin composition thermally cured.

CITATION LIST

Patent Literature

Patent Literature 1: National Publication of International Patent Application No. 2015-503220
Patent Literature 2: National Publication of International Patent Application No. 2014-521754
Patent Literature 3: Japanese Patent Laid-Open No. 2013-112730
Patent Literature 4: Japanese Patent No. 4587631

SUMMARY OF INVENTION

Technical Problem

A radically polymerizable monomer is, however, rapidly cured in general, and mobility of the mixed silane coupling agent in an adhesion portion is unavoidably controlled by a main resin that has been polymerized before forming a sufficient number of bonds with silanol groups present on a surface of the chip. As a result, sufficient adhesion to a chip cannot be obtained by the pre-applied underfill material described in Patent Literature 1. Since the radically polymerizable monomer is rapidly cured, it is cured before the resin composition fills irregularities present on the surface of the chip. As a result, there arises a problem that the pre-applied underfill material described in Patent Literature 1 cannot sufficiently obtain an anchoring effect that is useful for improvement of the adhesiveness.

The material described in Patent Literature 2 works merely on a polyimide passivation film, and hence the application range is narrow.

Furthermore, in the technique described in Patent Literature 3, a reaction of the carboxyl-group containing compound with the epoxy compound slightly proceeds even at room temperature, and hence flux activity is lowered over time during storage. Therefore, the pre-applied underfill material described in Patent Literature 3 has disadvantages of low connection stability and poor mass productivity.

In the technique described in Patent Literature 4, since water absorption of a maleimide resin is high, the adhesion to a chip obtained after a hygroscopic treatment is disadvantageously largely degraded.

The present invention was devised in consideration of the above-described problems, and an object is to provide a resin composition for an underfill material that has excellent adhesiveness to a chip and has suitable viscosity to be used in an underfill material, a laminate, a semiconductor wafer with a resin composition layer, a substrate for mounting a semiconductor with a resin composition layer, and a semiconductor device. Preferably, a resin composition for an underfill material that has excellent adhesiveness to a chip, has suitable viscosity to be used in an underfill material, has excellent flux activity and is excellent in flexibility, a laminate, a semiconductor wafer with a resin composition layer, a substrate for mounting a semiconductor with a resin composition layer, and a semiconductor device are provided.

Solution to Problem

The present inventors have made earnest studies to solve the above-described problems, and as a result, have found that a resin composition comprising a maleimide compound (A) and a secondary monoamino compound (B), the secondary monoamino compound (B) having a boiling point of 120° C. or more, can solve the above-described problems, and the present invention was thus accomplished.

The present invention encompasses:

[1]

A resin composition for an underfill material, comprising a maleimide compound (A) and a secondary monoamino compound (B), wherein the secondary monoamino compound (B) has a boiling point of 120° C. or more.

[2]

The resin composition according to [1], wherein the maleimide compound (A) comprises at least one selected from the group consisting of 2,2-bis{4-(4-maleimidophenoxy)phenyl}propane, 1,2-bis(maleimido)ethane, 1,4-bis(maleimido)butane, 1,6-bis(maleimido)hexane, N,N'-1,3-phenylenedimaleimide, N,N'-1,4-phenylenedimaleimide, N-phenylmaleimide, a maleimide compound represented by the following formula (1), a maleimide compound represented by the following formula (2), and a maleimide compound represented by the following formula (3):

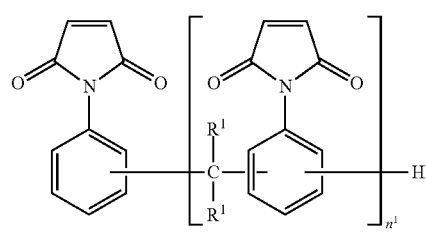

(1)

wherein $R^1$ each independently represents a hydrogen atom or a methyl group, and $n^1$ represents an integer of 1 or more;

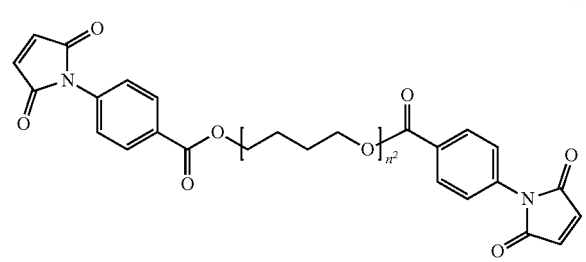

(2)

wherein $n^2$ represents an integer of 1 or more and 30 or less;

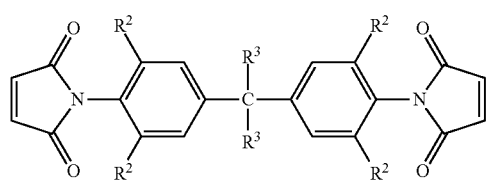

(3)

wherein $R^2$ each independently represents a hydrogen atom, a methyl group or an ethyl group, and $R^3$ each independently represents a hydrogen atom or a methyl group.

[3]

The resin composition according to [1] or [2], wherein the maleimide compound (A) comprises at least one selected from the group consisting of 2,2-bis{4-(4-maleimidophenoxy)phenyl}propane, the maleimide compound represented by formula (1), the maleimide compound represented by formula (2), and the maleimide compound represented by formula (3).

[4]

The resin composition according to any one of [1] to [3], wherein the secondary monoamino compound (B) comprises at least one selected from the group consisting of bis(2-methoxyethyl)amine, bis(2-ethoxyethyl)amine, bis(4-biphenylyl)amine, bis(3-biphenylyl)amine, Bindschedler's Green Leuco base, 2-acetamidoethanol, acetamidomethanol, 1-acetamidonaphthalene, bis(4-tert-butylphenyl)amine and a compound represented by the following formula (4):

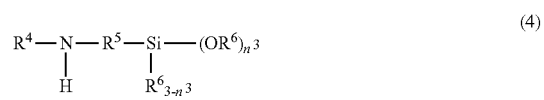

(4)

wherein $R^4$ represents an aryl group, an aralkyl group, an alkyl group or a cycloalkyl group, $R^5$ represents an alkylene group, $R^6$ each independently represents an alkyl group, and $n^3$ represents an integer of 1 to 3.

[5]

The resin composition according to [4], wherein the compound (B) comprises the compound represented by formula (4).

[6]

The resin composition according to [5], wherein the compound (B) is trimethoxy[3-(phenylamino)propyl]silane and/or [3-(cyclohexylamino)propyl]trimethoxysilane.

[7]

The resin composition according to any one of [1] to [6], wherein a content of the compound (B) is 0.5 to 30% by mass based on a total content of the maleimide compound (A).

[8]

The resin composition according to any one of [1] to [7], further containing an organic compound (C) having an acidic site.

[9]

The resin composition according to [8], wherein the compound (C) comprises at least one selected from the group consisting of abietic acid, neoabietic acid, dehydroabietic acid, pimaric acid, isopimaric acid, palustric acid, diphenolic acid, dihydroabietic acid, tetrahydroabietic acid, and an acid-modified rosin resin.

[10]

The resin composition according to any one of [1] to [9], further containing an inorganic filler (D).

[11]

The resin composition according to [10], wherein the inorganic filler (D) comprises at least one selected from the group consisting of silica, aluminum hydroxide, alumina, boehmite, boron nitride, aluminum nitride, magnesium oxide and magnesium hydroxide.

[12]

The resin composition according to [11], wherein the inorganic filler (D) comprises silica.

[13]

The resin composition according to any one of [1] to [12], further containing a flexibility-imparting component (E).

[14]

The resin composition according to [13], wherein the flexibility-imparting component (E) comprises an acrylic oligomer and/or an acrylic polymer.

[15]

The resin composition according to any one of [1] to [14], for use in a pre-applied underfill material.

[16]

A laminate, comprising: a supporting material; and a layer containing the resin composition according to any one of [1] to [15] stacked on the supporting material.

[17]

A semiconductor wafer with a resin composition layer, comprising: a semiconductor wafer; and the layer comprising the resin composition of the laminate according to [16] stacked on the semiconductor wafer.

[18]

A substrate for mounting a semiconductor with a resin composition layer, comprising: a substrate for mounting a semiconductor; and the layer comprising the resin composition of the laminate according to [16] stacked on the substrate for mounting a semiconductor.

[19]

A semiconductor device, comprising: the semiconductor wafer with a resin composition layer according to [17]; and/or the substrate for mounting a semiconductor with a resin composition layer according to [18].

A resin laminate obtained by applying the resin composition according to any one of [1] to [15] to a supporting material.

A semiconductor wafer with a resin composition layer, formed by using the resin laminate according to [16] and a semiconductor wafer.

A substrate for mounting a semiconductor with a resin composition layer, formed by using the resin laminate according to [16] and a substrate for mounting a semiconductor.

A semiconductor device produced by using the semiconductor wafer with the resin composition layer according to [17] and/or the substrate for mounting the semiconductor with the resin composition layer according to [18].

Advantageous Effects of Invention

According to the present invention, a resin composition for an underfill material having excellent adhesiveness to a chip and having a suitable viscosity to be used as an underfill material, a laminate, a semiconductor wafer with a resin composition layer, a substrate for mounting a semiconductor with a resin composition layer, and a semiconductor device can be obtained.

DESCRIPTION OF EMBODIMENT

An embodiment for practicing the present invention (hereinafter simply referred to as the "present embodiment") will be hereinafter described. It is noted that the following present embodiment is merely an example and the present invention is not limited to the present embodiment.

According to one aspect of the present invention, a resin composition for an underfill material comprises a maleimide compound (A) and a secondary monoamino compound (B), and the secondary monoamino compound (B) has a boiling point of 120° C. or more. The resin composition is preferably for use in a pre-applied underfill material from the viewpoint of more effectively and definitely obtaining the function effect of the present invention.

In another aspect of the present embodiment, the resin composition comprises, in addition to the above-described resin composition components, an organic compound (C) having an acidic site.

In still another aspect of the present embodiment, the resin composition comprises, in addition to the above-described resin composition components, an inorganic filler (D).

In still another aspect of the present embodiment, the resin composition comprises, in addition to the above-described resin composition components, a flexibility-imparting component (E).

In still another aspect of the present invention, a laminate obtained by using the resin composition of the present embodiment (hereinafter also referred to as the "resin laminate"), a semiconductor wafer with a resin composition layer produced by using the laminate, a substrate for mounting a semiconductor with a resin composition layer produced by using the laminate, and a semiconductor device produced by using the resin composition of the present invention are also provided.

[I. Resin Composition]

The resin composition of the present invention is a resin composition to be used as an underfill material preferably used in flip-chip bonding of a chip, and comprises the maleimide compound (A) and the secondary monoamino compound (B), and the second monoamino compound (B) has a boiling point of 120° C. or more. The resin composition of the present embodiment may further comprise at least any one of the organic compound (C) having an acidic site, the inorganic filler (D) and the flexibility-imparting component (E).

[I-1. Maleimide Compound (A)]

The maleimide compound (A) of the resin composition of the present embodiment is not especially limited as long as it is a compound having one or more maleimide groups in a molecule. Specific examples thereof include N-phenylmaleimide, N-hydroxyphenylmaleimide, bis(4-maleimidophenyl)methane, 4,4-diphenylmethane bismaleimide, bis(3,5-dimethyl-4-maleimidophenyl)methane, bis(3-ethyl-5-methyl-4-maleimidophenyl)methane, bis(3,5-diethyl-4-maleimidophenyl)methane, phenylmethane maleimide, o-phenylene bismaleimide, m-phenylene bismaleimide, p-phenylene bismaleimide, o-phenylene biscitraconimide, m-phenylene biscitraconimide, p-phenylene biscitraconimide, 2,2-bis(4-(4-maleimidophenoxy)-phenyl)propane, 3,3-dimethyl-5,5-diethyl-4,4-diphenylmethane bismaleimide, 4-methyl-1,3-phenylene bismaleimide, 1,6-bismaleimido-(2,2,4-trimethyl)hexane, 4,4-diphenylether bismaleimide, 4,4-diphenylsulfone bismaleimide, 1,3-bis(3-maleimidophenoxy)benzene, 1,3-bis(4-maleimidophenoxy)benzene, 4,4-diphenylmethane biscitraconimide, 2,2-bis[4-(4-citraconimidophenoxy)phenyl]propane, bis(3,5-dimethyl-4-citraconimidophenyl)methane, bis(3-ethyl-5-methyl-4-citraconimidophenyl)methane, bis(3,5-diethyl-4-citraconimidophenyl)methane, polyphenylmethane maleimide, a novolac-type maleimide compound, a biphenylaralkyl-type maleimide compound, 2,2-bis{4-(4-maleimidophenoxy)phenyl}propane, 1,2-bis(maleimido)ethane, 1,4-bis(maleimido)butane, 1,6-bis(maleimido)hexane, N,N'-1,3-phenylenedimaleimide, N,N'-1,4-phenylenedimaleimide, a maleimide compound represented by the following formula (1), a maleimide compound represented by the following formula (2), and a maleimide compound represented by the following formula (3).

One of these compounds can be used singly, or an appropriate mixture of two or more of these can be used as the maleimide compound (A).

Among these, from the viewpoint of solubility in an organic solvent, 2,2-bis{4-(4-maleimidophenoxy)phenyl}propane, 1,2-bis(maleimido)ethane, 1,4-bis(maleimido)butane, 1,6-bis(maleimido)hexane, N,N'-1,3-phenylenedimaleimide, N,N'-1,4-phenylenedimaleimide, N-phenylmaleimide, a maleimide compound represented by the following formula (1), a maleimide compound represented by the following formula (2) and a maleimide compound represented by the following formula (3) are preferred, and 2,2-bis{4-(4-maleimidophenoxy)phenyl}propane, a maleimide compound represented by the following formula (1), a maleimide compound represented by the following formula (2) and a maleimide compound represented by the following formula (3) are more preferred. As a maleimide compound represented by the following formula (3), bis(3-ethyl-5-methyl-4-maleimidophenyl)methane is preferred.

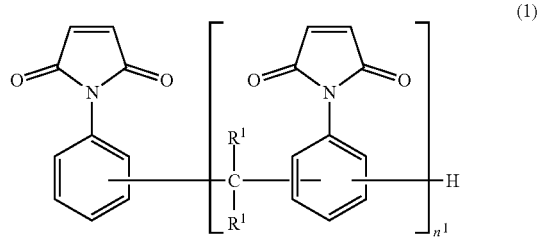

(1)

In formula (1), $R^1$ each independently represents a hydrogen atom or a methyl group, and is preferably a hydrogen atom.

In formula (1), $n^1$ represents an integer of 1 or more, and the upper limit of $n^1$ is usually 10, and preferably 7 from the viewpoint of the solubility in an organic solvent.

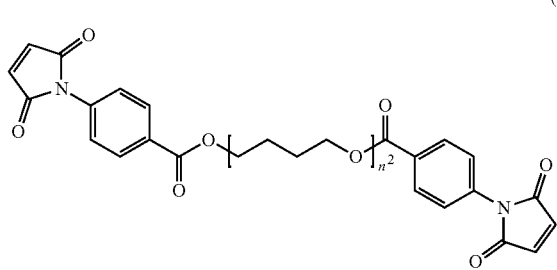

(2)

In formula (2), $n^2$ represents an integer of 1 or more and 30 or less, and is in a range of 7 to 30 on average. From the viewpoint of more effectively and definitely attaining the function effect of the present invention, $n^2$ is preferably in a range of 7 to 18.

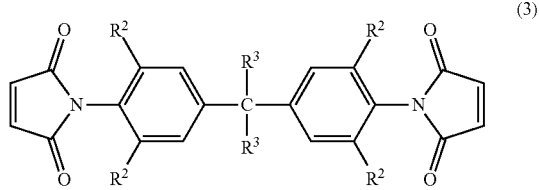

(3)

In formula (3), $R^2$ each independently represents a hydrogen atom, a methyl group or an ethyl group.

In formula (3), $R^3$ each independently represents a hydrogen atom or a methyl group.

From the viewpoint of the solubility in an organic solvent and flexibility, it is more preferable that the maleimide compound (A) of the resin composition of the present embodiment comprises a maleimide compound represented by formula (2) as an essential component and further comprises at least one maleimide compound selected from the group consisting of 2,2-bis{4-(4-maleimidophenoxy)phenyl}propane, a maleimide compound represented by formula (1) and a maleimide compound represented by formula (3).

The maleimide compound (A) of the resin composition of the present embodiment is not especially limited and, from the viewpoint that good solubility in an organic solvent and good flexibility can be obtained, it comprises, based on 100 parts by mass of the maleimide compound (A), 5 to 40 parts by mass, and preferably 10 to 35 parts by mass of a maleimide compound represented by formula (2), 5 to 50 parts by mass, and preferably 10 to 35 parts by mass of 2,2-bis{4-(4-maleimidophenoxy)phenyl}propane, 5 to 40 parts by mass, and preferably 5 to 25 parts by mass of a maleimide compound represented by formula (1), and 5 to 50 parts by mass, and preferably 10 to 35 parts by mass of a maleimide compound represented by formula (3).

The maleimide compound (A) can be contained in the resin composition in the form of a prepolymer obtained by polymerizing a maleimide compound, a prepolymer obtained by polymerizing a maleimide compound with another compound such as an amine compound, or the like.

One of these compounds can be used singly or an appropriate mixture of two or more of these can be used as the maleimide compound (A).

[I-2. Secondary Monoamino Compound (B) Having Boiling Point of 120° C. or More]

The compound (B) of the resin composition of the present embodiment is not especially limited as long as it is a compound having, in a molecule, merely one secondary amino group as a functional group to be reacted with the maleimide compound (A) and having a boiling point of 120° C. or more.

An addition reaction caused between the compound (B) and the maleimide compound (A) exhibits higher reactivity than a polymerization reaction of the maleimide compounds (A). When this addition reaction proceeds, a maleimide group of the maleimide compound (A) to which the compound (B) has been bonded loses its function to polymerize with another maleimide compound (A), and the compound (B) also loses the function to cause the addition reaction with another maleimide compound (A) because it has merely one secondary amino group as the functional group capable of reacting with a maleimide group. As a result, the proportion of a polymer resulting from polymerization of the maleimide compounds (A) can be suppressed low, and therefore, a melt viscosity of the resin composition can be lowered and a time when it has a low viscosity can be elongated. Incidentally, in using a di- or higher functional amino compound such as an amino compound having two or more secondary amino groups, the number of sites where the addition reaction between the compound (B) and the maleimide compound (A) is large and as a result, the polymerization excessively proceeds, and therefore, the viscosity of the resin composition is increased so that the minimum melt viscosity required of an underfill material cannot be obtained. When the viscosity of the resin composition is lowered, the mobility of a polar functional group concerned in the adhesiveness of the resin composition to a chip is improved, and the resin composition is made to easily follow irregularities present on the surface of the chip, so as to improve a filling property of the resin composition. As a result, the resin composition and the chip obtains sufficient adhesiveness owing to a chemical bond between a polar functional group of the resin composition and a silanol group of the chip and an anchoring effect derived from the filling of the resin composition in the irregularities of the chip. From the viewpoint that the solvent can be easily removed from a resin composition layer, the boiling point of the compound (B) is preferably 120° C. or more.

Specific examples of the compound (B) include bis(2-methoxyethyl)amine, bis(2-ethoxyethyl)amine, bis(4-biphenylyl)amine, bis(3-biphenylyl)amine, Bindschedler's Green Leuco base, 2-acetamidoethanol, acetamidomethanol, 1-acetamidonaphthalene, bis(4-tert-butylphenyl)amine and a compound represented by the following formula (4).

One of these compounds or an appropriate mixture of two or more of these can be used as the compound (B).

Among these, from the viewpoint of improving the adhesiveness of the resin composition, a compound represented by the following formula (4) generating a silanol group concerned in the adhesiveness through a hydrolysis reaction is preferred.

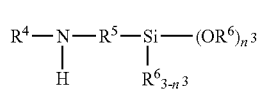

In formula (4), $R^4$ represents an aryl group, an aralkyl group, an alkyl group or a cycloalkyl group.

Examples of the aryl group and the aralkyl group include a phenyl group, a benzyl group, a phenethyl group, a tolyl group, a xylyl group and a naphthyl group. A phenyl group and a benzyl group are preferred.

As the alkyl group, an alkyl group having 1 to 20 carbon atoms is preferred, and an alkyl group having 1 to 10 carbon atoms is more preferred. Specific examples thereof include a methyl group, an ethyl group, a propyl group, an isopropyl group, a butyl group and an octyl group.

Examples of the cycloalkyl group include a cyclopropyl group, a cyclobutyl group, a cyclopentyl group and a cyclohexyl group. A cyclohexyl group is preferred.

In formula (4), $R^5$ represents an alkylene group, and is preferably an alkylene group having 1 to 10 carbon atoms, more preferably an alkylene group having 1 to 8 carbon atoms, and further preferably an ethylene group, a propylene group, a butylene group or an octylene group.

In formula (4), $R^6$ each independently represents an alkyl group, and is preferably an alkyl group having 1 to 10 carbon atoms, more preferably an alkyl group having 1 to 5 carbon atoms, and further preferably a methyl group or an ethyl group.

In formula (4), $n^3$ represents an integer of 1 to 3.

Among compounds represented by formula (4), trimethoxy[3-(phenylamino)propyl]silane, trimethoxy[3-(phenylamino)octyl]silane and [3-(cyclohexylamino)propyl]trimethoxysilane are particularly preferred.

In the resin composition of the present embodiment, a content of the compound (B) is not especially limited, and from the viewpoint of attaining both the adhesion to a chip and a curing rate of the resin composition, is preferably 0.5 to 30% by mass, more preferably 1 to 15% by mass, and further preferably 1 to 10% by mass based on a total content of the maleimide compound (A).

[I-3. Organic Compound (C) Having Acidic Site]

The resin composition of the present embodiment preferably comprises the compound (C) in order to exhibit the flux activity in the flip-chip bonding. The compound (C) is not especially limited as long as it is an organic compound having one or more acidic sites in a molecule. The acidic site is preferably a phosphate group, a carboxyl group, a sulfonate group or the like, and is more preferably a carboxyl group from the viewpoint of more effectively preventing migration and corrosion of a metal such as a solder or copper included in a connecting portion in a semiconductor device in which the resin composition of the present embodiment is used as an underfill material, and preferably as a pre-applied underfill material.

The compound (C) of the resin composition of the present embodiment has a molecular weight of preferably 200 or more, and more preferably 250 or more from the viewpoint of preventing volatilization thereof before exhibiting the flux activity in the flip-chip bonding, namely, preventing volatilization of the compound (C) before removing an oxidized layer of the connecting portion. In order to have mobility as an acid and attain sufficient flux activity, the molecular weight is preferably 8000 or less, more preferably 1000 or less, and further preferably 500 or less.

In the compound (C), a functional group equivalent of the acidic site is preferably 10000 g/eq. or less in order to sufficiently remove the oxidized layer of the connecting portion, and is more preferably 5000 g/eq. or less, further preferably 1000 g/eq. or less, and much further preferably 500 g/eq. or less from the viewpoint of attaining the function effect of the present invention more effectively and definitely. The lower limit value thereof is not especially limited, and is, for example, 50 g/eq.

The compound (C) is preferably a component having flux activity such as rosin acids, and a rosin acid comprising a carboxylic acid having a molecular weight of 200 to 3000 is more preferred. As the rosin acids, a rosin acid comprising at least one selected from abietic acid, neoabietic acid, dehydroabietic acid, pimaric acid, isopimaric acid, palustric acid, diphenolic acid, dihydroabietic acid, tetrahydroabietic acid, and an acid-modified rosin resin is preferred, and a rosin acid comprising at least one selected from dihydroabietic acid, dehydroabietic acid, tetrahydroabietic acid and an acid-modified rosin resin is more preferred.

One of these compounds can be used singly, or an appropriate mixture of two or more of these can be used.

Among these, from the viewpoint of preventing deactivation otherwise caused by the maleimide compound (A), diphenolic acid, dihydroabietic acid, dehydroabietic acid, tetrahydroabietic acid and an acid-modified rosin resin are more preferred. In particular, dehydroabietic acid, tetrahydroabietic acid and an acid-modified rosin resin are particularly preferred from the viewpoint that sufficient flux activity necessary for removing the oxidized layer can be retained because such a compound does not have a highly reactive non-aromatic carbon-carbon unsaturated bond and hence is minimally reactive with the maleimide compound (A).

As the compound (C), a commercially available product can be used, and examples thereof include abietic acid, dehydroabietic acid and dihydroabietic acid produced by Wako Pure Chemical Industries Ltd., and an acid-modified rosin resin produced by Arakawa Chemical Industries, Ltd.

A content of the compound (C) in the resin composition of the present embodiment is not limited, and from the viewpoint of obtaining both the flux activity of the resin composition and the flexibility, that is, one of significant properties in usage for forming a laminate, the content is preferably 5 to 50% by mass, more preferably 10 to 40% by mass, and further preferably 15 to 30% by mass based on the total content of the maleimide compound (A) in the resin composition.

[I-4. Inorganic Filler (D)]

The resin composition of the present embodiment can comprise the inorganic filler (D) in order to improve fire resistance, improve thermal conductivity and reduce a thermal expansion coefficient. When the inorganic filler is used, the fire resistance and the thermal conductivity of the resin composition and the like can be improved, and the thermal expansion coefficient thereof can be reduced.

The type of the inorganic filler (D) is not especially limited, and examples thereof include silica (such as natural silica, fused silica, amorphous silica and hollow silica), aluminum compounds (such as boehmite, aluminum hydroxide, alumina and aluminum nitride), magnesium compounds (such as magnesium oxide and magnesium hydroxide), calcium compounds (such as calcium carbonate and calcium sulfate), molybdenum compounds (such as molybdenum oxide and zinc molybdate), boron nitride, barium sulfate, talc (such as natural talc and calcined talc), mica, and glass (such as short fibrous glass, spherical glass, finely powdered glass (such as E-glass, T-glass and D-glass)). If the resin composition is desired to be provided with conductivity or anisotropic conductivity, a metal particle (of, for example, gold, silver, nickel, copper, a tin alloy or palladium) may be used as the inorganic filler (D).

One of these may be used singly, or any combinations of two or more of these at any ratio may be used as the inorganic filler (D).

As the inorganic filler (D), one having been surface-treated with a silane coupling agent may be used.

The silane coupling agent is not especially limited as long as it is a silane coupling agent generally used for a surface treatment of an inorganic substance. Specific examples thereof include vinylsilane-based silane coupling agents such as vinyltrimethoxysilane and γ-methacryloxypropyltrimethoxysilane, phenylsilane-based silane coupling agents such as trimethoxyphenylsilane, and imidazolesilane-based silane coupling agents. One of these silane coupling agents can be used singly, or an appropriate combination of two or more of these can be used.

Among these, from the viewpoint of improving the fire resistance as well as reducing the thermal expansion coefficient of the resin composition, the inorganic filler (D) is preferably silica, aluminum hydroxide, alumina, boehmite, boron nitride, aluminum nitride, magnesium oxide or magnesium hydroxide, and more preferably silica, alumina or boron nitride, among which fused silica is particularly preferred. Specific examples of the fused silica include SFP-120MC, SF-130MC and the like manufactured by Denka Company Limited, and SC1050-MLQ, SC2050-MNU, SC2050-MTX, SE2053-SQ, YA050C-MJF, YA050C-MJA manufactured by Admatechs Company Limited.

An average particle size of the inorganic filler (D) is not limited, and when the resin composition of the present embodiment is used as an underfill material, and preferably as a pre-applied underfill material, it is preferably 3 μm or less, and more preferably 1 μm or less from the viewpoint of coping with reduction in pitch between electrodes arranged on a chip and reduction in gap between electrodes. The lower limit of the average particle size is not especially limited, and is, for example, 10 nm. It is noted that the "average particle size" of the inorganic filler (D) herein means a median diameter of the inorganic filler (D). A median diameter here means a particle size obtained, when a particle size distribution of a powder is divided into two groups based on a given particle size, as a particle size where a volume of particles belonging to a larger size group and a volume of particles belong to a smaller size group respectively occupy 50% of the whole powder. The average particle size (the median diameter) of the inorganic filler (D) is measured by a wet laser diffraction-scattering method.

When the inorganic filler (D) is used, a content thereof in the resin composition is preferably 300% by mass or less, and more preferably 200% by mass or less based on a total amount (100% by mass) of the maleimide compound (A), the compound (C) and the flexibility-imparting component (E) from the viewpoint of attaining flowability at the time of the connection of the underfill material, preferably of the pre-applied under fill material, with the fire resistance of the resin composition improved and the thermal expansion coefficient reduced. The content is preferably 10% by mass or more, more preferably 20% by mass or more, and further preferably 50% by mass or more. Incidentally, when two or more inorganic fillers (D) are used together, a total amount thereof preferably falls within the above-described range of the content.

When the inorganic filler (D) is used, the content thereof in the resin composition is preferably 300% by mass or less, and more preferably 200% by mass or less based on the total content of the maleimide compound (A) from the viewpoint of attaining the flowability at the time of the connection of the underfill material, preferably of the pre-applied under fill material, with the fire resistance of the resin composition improved and the thermal expansion coefficient reduced. The content is preferably 10% by mass or more, more preferably 20% by mass or more, and further preferably 40% by mass or more. Incidentally, when two or more inorganic fillers (D) are used together, a total amount thereof preferably satisfies the above-described proportion.

[I-5. Flexibility-Imparting Component (E)]

The flexibility-imparting component (E) of the resin composition of the present embodiment is not especially limited as long as it is a component capable of imparting flexibility to a layer comprising the resin composition, and examples thereof include thermoplastic polymer compounds such as polyimide, polyamideimide, polystyrene, polyolefin, styrene-butadiene rubber (SBR), isoprene rubber (IR), butadiene rubber (BR), acrylonitrile butadiene rubber (NBR), polyurethane, polypropylene, an acrylic oligomer, an acrylic polymer and a silicone resin.

One of these may be used singly, or any combinations of two or more of these at any ratio may be used as the flexibility-imparting component (E).

Among these, from the viewpoints of solubility in an organic solvent used in producing the resin composition, compatibility with the maleimide compound, controllability of melt viscosity of the resin composition and flexibility imparting, an acrylic oligomer and an acrylic polymer are preferred. Specific examples of the acrylic oligomer and the acrylic polymer include "ARUFON®" series available from Toagosei Co., Ltd., "Actflow®" series available from Soken Chemical & Engineering Co., Ltd., "PARACRON®" series available from Negami Chemical Industrial Co., Ltd., and "KURARITY®" series available from Kuraray Co., Ltd.

A molecular weight of the flexibility-imparting component (E) is not limited, and from the viewpoint of imparting flexibility to the resin composition, a weight average molecular weight is preferably 1000 or more, and more preferably 2000 or more. When the resin composition is used as an underfill material, and preferably as a pre-applied underfill material, in order to prevent the resin composition from being entrapped in a metal connecting portion and to obtain connection in a good and stable shape, the melt viscosity of the resin composition needs to be controlled low to attain the flowability of the resin composition at the time of the connection. From this point of view, the weight average molecular weight of the flexibility-imparting component (E) is preferably 1000000 or less, more preferably 800000 or less, further preferably 100000 or less, and still further preferably 10000 or less. When the used flexibility-imparting component (E) has a weight average molecular weight falling in this preferable range, the flexibility of the resin composition and a connecting property obtained in using the resin composition as an underfill material, and preferably as a pre-applied underfill material can be both attained in a well-balanced manner. It is noted that the "weight average molecular weight" of the flexibility-imparting component (E) herein means a weight average molecular weight in terms of polystyrene standard measured by gel permeation chromatography (GPC).

When the flexibility-imparting component (E) is used, a content thereof in the resin composition is preferably 100% by mass or less, more preferably 50% by mass or less, and further preferably 30% by mass or less based on the total content of the maleimide compound (A) from the viewpoint of the controllability of the melt viscosity. The content of the flexibility-imparting component (E) in the resin composition is preferably 1% by mass or more, and more preferably 5% by mass or more. Incidentally, when two or more flexibility-imparting components (E) are used together, a total amount of these preferably satisfy the above-described proportion.

[I-6. Additional Component]

The resin composition of the present embodiment may comprise, in addition to the maleimide compound (A), the compound (B), the compound (C), the inorganic filler (D) and the flexibility-imparting component (E), one, two or more additional components.

The resin composition of the present embodiment may comprise, for example, a coupling agent for purposes of improving the adhesiveness in the interface between the resin and the filler and improving moisture absorption and heat resistance. The coupling agent is different from the compound (B). Specific examples thereof include vinylsilane-based silane coupling agents (such as vinyltrimethoxysilane and γ-methacryloxypropyltrimethoxysilane), phenylsilane-based silane coupling agents (such as trimethoxyphenylsilane), and imidazolesilane-based silane coupling agents. One of these silane coupling agents may be used singly, or any combinations of two or more of these at any ratio may be used.

When the coupling agent is used, a content thereof in the resin composition is not limited, and from the viewpoints of improving the moisture absorption and heat resistance and reducing a volatilization amount at the time of the flip-chip bonding, the content is preferably 0.4 to 15% by mass, and more preferably 0.8 to 10% by mass based on a total content of the maleimide compound (A) and the inorganic filler (D).

The resin composition of the present embodiment may comprise a wetting and dispersing agent for purposes of improving productivity of a laminate, dispersibility of the filler, and the like. The wetting and dispersing agent is not limited as long as it is a wetting and dispersing agent generally used in a paint or the like. Specific examples thereof include Disperbyk®-110, -111, -180 and -161, and BYK-W996, -W9010 and -W903 manufactured by BYK Japan KK. One of these wetting and dispersing agents may be used singly, or any combinations of two or more of these at any ratio may be used.

When the wetting and dispersing agent is used, a content thereof in the resin composition is not limited, and from the viewpoint of improving the productivity of the laminate, the proportion of the wetting and dispersing agent based on the inorganic filler (D) is preferably 0.1 to 5% by mass, and more preferably 0.5 to 3% by mass.

Incidentally, when two or more wetting and dispersing agents are used together, a total amount thereof preferably satisfies the above-described proportion.

The resin composition of the present embodiment may comprise a curing accelerator for purposes of adjusting a cure rate and the like. The curing accelerator is not especially limited as long as it is known as a curing accelerator for a maleimide compound and is generally used. Specific examples of the curing accelerator include imidazoles and derivatives thereof (such as 2-ethyl-4-methylimidazole, 2-phenyl-4-methylimidazole, 1-benzyl-2-phenylimidazole and 2,4,5-triphenylimidazole), and tertiary amines (such as triethylamine and tributylamine). One of these curing accelerators may be used singly, or any combinations of two or more of these at any ratio may be used.

When the curing accelerator is used, a content thereof in the resin composition is not limited, and from the viewpoint of adjusting the cure rate, the proportion of the curing accelerator to the total content of the maleimide compound (A) is preferably 0.01 to 10% by mass, more preferably 0.05 to 2% by mass, and further preferably 0.1 to 1% by mass. Incidentally, when two or more curing accelerators are used together, a total amount thereof preferably satisfies the above-described proportion.

The resin composition of the present embodiment may comprise various additives for various purposes as long as desired characteristics are not impaired. Examples of the additives include an ultraviolet absorber, an antioxidant, a photopolymerization initiator, a fluorescent brightener, a photosensitizer, a dye, a pigment, a thickener, a lubricant, an antifoaming agent, a leveling agent, a polish, and a flame retardant. One of these additives may be used singly, or any combinations of two or more of these at any ratio may be used.

In the resin composition of the present embodiment, a content of such an additive is not especially limited, and is usually 0.1 to 10% by mass based on the total content of the maleimide compound (A).

The resin composition of the present embodiment is prepared by mixing the maleimide compound (A) and the compound (B) as the essential components, and if necessary, the compound (C), the inorganic filler (D), the flexibility-imparting component (E) and additional components. The composition may be in the form of a varnish obtained by dissolving or dispersing these components in an organic solvent, if necessary. Such a varnish of the resin composition of the present embodiment can be suitably used as a varnish in producing a laminate of the present embodiment described later. The organic solvent is not limited as long as it can suitably dissolve or disperse the above-described components and does not impair the desired effects of the resin composition of the present embodiment. Specific examples of the organic solvent include alcohols (such as methanol, ethanol and propanol), ketones (such as acetone, methyl ethyl ketone and methyl isobutyl ketone), amides (such as dimethylacetamide and dimethylformamide), and aromatic hydrocarbons (such as toluene and xylene). One of these organic solvents may be used singly, or any combinations of two or more of these at any ratio may be used.

The resin composition of the present embodiment is excellent in the adhesiveness to a chip, the flux activity, the flexibility and low thermal expansion. When the resin composition is applied onto a supporting material, a laminate including a resin layer excellent in the adhesiveness to a chip can be provided. When the resin composition of the present embodiment is used as a pre-applied underfill material to be used in the form of a laminate, suitable effects of being excellent in the adhesion to a chip, the flux activity, the flexibility and the low thermal expansion as well as being excellent in the connecting property and the moisture absorption and heat resistance can be exhibited. In this manner, the resin composition of the present embodiment has various excellent features, and in particular, the adhesiveness to a chip, the flux activity, the flexibility and the low thermal expansion can be all attained at a high level, and therefore, it is extremely useful as an underfill material, particularly as a pre-applied underfill material.

[II. Laminate, Semiconductor Wafer with Resin Composition Layer Produced by Using Laminate, Resin Composition Layer-Equipped Substrate Produced by Using Laminate, and Semiconductor Device]

A laminate, a semiconductor wafer with a resin composition layer, a resin composition layer-equipped substrate such as a substrate for mounting a semiconductor with a resin composition layer, and a semiconductor device of the present embodiment are all formed by using the resin composition of the present invention described above.

[II-1. Laminate]

The laminate of the present embodiment includes a supporting material and a layer comprising the resin composition of the present embodiment and stacked on the supporting material. In such a laminate, the resin composition of the present embodiment described above is attached to the supporting material. The supporting material is not especially limited, and a polymer film can be used. Specific examples of a material of the polymer film include a film comprising at least one or more resins selected from the group consisting of polyvinyl chloride, polyvinylidene chloride, polybutene, polybutadiene, polyurethane, an ethylene-vinyl oxide copolymer, polyesters such as polyethylene terephthalate, polyethylene naphthalate and polybutylene terephthalate, polyethylene, polypropylene, an ethylene-propylene copolymer, polymethyl pentene, polyimide and polyamide, and a release film obtained by applying a release agent to a surface of any of these films. Among these, polyester, polyimide and polyamide are preferred, among which polyethylene terephthalate, that is, a kind of polyester, is particularly preferred.

A thickness of the supporting material of the present embodiment is not limited, and from the viewpoint of the productivity of the laminate, such as stability in application thickness in applying the resin composition onto the supporting material, the thickness is preferably 10 to 100 µm. Also from the viewpoint of transportability of the laminate, the thickness is preferably 10 to 100 µm. Furthermore, the lower limit of the thickness is further preferably 12 µm or more, particularly preferably 25 µm or more, and extremely preferably 30 µm or more from the viewpoint of securing a yield in producing the laminate. The upper limit of the thickness is preferably 50 µm or less from the viewpoint of production cost of the laminate because the supporting material is not present ultimately as a composing member of a semiconductor device but is peeled off during the process.

A method for producing the laminate of the present embodiment by forming, on the above-described supporting material, a layer comprising the resin composition of the present embodiment (hereinafter also simply referred to as the "resin composition layer") is not limited. As the production method, for example, a varnish obtained by dissolving or dispersing the resin composition of the present embodiment in an organic solvent is applied to a surface of the supporting material, the resultant is heated and/or dried under reduced pressure so as to cure the resin composition of the present embodiment with the solvent removed, and thus, the resin composition layer is formed. Conditions for drying are not especially limited, and the drying is performed with a content ratio of the organic solvent in the resin composition layer set to usually 10% by mass or less, and preferably 5% by mass or less based on a total amount (100% by mass) of the resin composition layer. The conditions for performing such drying vary depending on the type and the content of the organic solvent in the varnish. For example, when the varnish comprises 20 to 120% by mass of methyl ethyl ketone based on a total content of the maleimide compound (A) and the compound (B) in the resin composition, preferably based on a total content of the maleimide compound (A), the compound (B) and the compound (C) in the resin composition, the drying is performed under 1 atm. with heating at 90 to 160° C. for about 3 to 10 minutes for reference. A thickness of the resin composition layer in the laminate of the present embodiment is not limited, and is suitably in a range of 5 to 500 µm, and more preferably in a range of 10 to 100 µm from the viewpoint of more satisfactorily removing a light volatile component at the time of the drying of the resin composition layer and from the viewpoint of more effectively and definitely attaining the function as the laminate.

[II-2. Semiconductor Wafer with Resin Composition Layer Produced by Using Laminate, and Resin Composition Layer-Equipped Substrate Produced by Using Laminate]

The semiconductor wafer with the resin composition layer of the present embodiment includes a semiconductor wafer, and the resin composition layer of the above-described laminate stacked on the semiconductor wafer, and is formed from the laminate of the present embodiment described above and a semiconductor wafer. The resin composition layer-equipped substrate of the present embodiment includes a substrate, and the resin composition layer of the above-described laminate stacked on the substrate, and is formed from the laminate of the present embodiment described above and a substrate.

A method for producing the semiconductor wafer with the resin composition layer of the present embodiment is not limited, and for example, the semiconductor wafer is obtained by bonding a surface of a semiconductor wafer having electrodes formed thereon, namely, a surface to be bonded to a substrate, to oppose the resin composition layer of the laminate of the present embodiment. A method for producing the resin composition layer-equipped substrate of the present embodiment is not limited, and for example, the substrate is obtained by bonding a surface of a substrate for mounting a chip thereon to oppose the resin composition layer of the laminate of the present embodiment.

A method for bonding the laminate of the present embodiment to a semiconductor wafer or a substrate is not especially limited, and a vacuum pressure laminator can be suitably used. In this case, a bonding method in which a pressure is applied to the laminate of the present embodiment through an elastic body of rubber or the like is preferably employed. Conditions for laminating are not especially limited as long as they are conditions generally employed in the art, and for example, the bonding is performed at a temperature of 50 to 140° C. under a contact pressure in a range of 1 to 11 kgf/cm$^2$ and an environment of reduced pressure of 20 hPa or less. After the laminating step, the bonded laminate may be flattened by hot pressing using a metal plate. The laminating step and the smoothing step can be continuously performed using a commercially available vacuum pressure laminator. In either case, the supporting material is removed from the laminate bonded to the semiconductor wafer or the substrate before performing the flip-chip bonding of a chip.

[II-3. Semiconductor Device]

The semiconductor device of the present embodiment includes the semiconductor wafer with the resin composition layer of the present embodiment and/or the resin composition layer-equipped substrate of the present embodiment, and is constructed from the resin composition layer of the present embodiment, a chip, a substrate and the like. A method for producing the semiconductor device of the present embodiment is not limited, and for example, the semiconductor wafer with the resin composition layer of the present embodiment is thinned by grinding or the like and then diced using a dicing saw or the like to obtain a resin composition layer-equipped chip, and the thus obtained chip is mounted on a substrate. The chip may be mounted on the resin composition layer-equipped substrate of the present embodiment. In a method for mounting the resin composition layer-equipped chip on a substrate and a method for mounting a semiconductor chip on the resin composition layer-equipped substrate, a flip chip bonder compliant with thermocompression bonding can be suitably used. Although the flip-chip bonding of a chip onto a substrate is described for convenience sake in the present embodiment, the resin composition of the present embodiment can be applied to a target different from a substrate while performing the flip-chip bonding to a chip. For example, the resin composition of the present embodiment can be used in a connecting portion between a semiconductor wafer and a chip in mounting the chip on the semiconductor wafer, or in a connecting portion between chips of chip laminates used in connecting the chips through a TSV (through silicon via) or the like, and in either case, advantages of the present invention can be obtained.

EXAMPLES

The present invention will be hereinafter described in detail with reference to Examples and Comparative Examples, and it is to be noted that the present invention is not limited to these Examples.

1. Preparation of Resin Composition and Resin Laminate

Example 1

A varnish was obtained by mixing and stirring with a high-speed mixer for 30 minutes the following: 26 parts by mass (corresponding to 13 parts by mass in terms of a non-volatile content) of a methyl ethyl ketone (hereinafter abbreviated as "MEK") solution (having a non-volatile content of 50% by mass) of a maleimide compound of formula (1) in which R$^1$ all represents a hydrogen atom and n$^1$ represents 1 to 3 (BMI-2300, manufactured by Daiwa Fine Chemicals Co., Ltd.) used as a first maleimide compound (A); 50 parts by mass (corresponding to 25 parts by mass in terms of a non-volatile content) of an MEK solution (having a non-volatile content of 50% by mass) of a maleimide compound represented by formula (2) (in which n$^2$ represents 14 (on average), BMI-1000P, manufactured by K•I Chemical Industry Co., Ltd.,) used as a second maleimide compound (A); 52 parts by mass (corresponding to 26 parts by mass in terms of a non-volatile content) of an MEK solution (having a non-volatile content of 50% by mass) of bis-(3-ethyl-5-methyl-4-maleimidophenyl)methane (BMI-70, manufactured by K•I Chemical Industry Co., Ltd.) used as a third maleimide compound (A); 52 parts by mass (corresponding to 26 parts by mass in terms of a non-volatile content) of an MEK solution (having a non-volatile content of 50% by mass) of 2,2-bis{4-(4-maleimidophenoxy)phenyl}propane (BMI-80, manufactured by K•I Chemical Industry Co., Ltd.) used as a fourth maleimide compound (A); 1 part by mass of trimethoxy[3-(phenylamino)propyl]silane (KBM-573, manufactured by Shin-Etsu Chemical Co., Ltd.) used as a compound (B); 40 parts by mass (corresponding to 20 parts by mass in terms of a non-volatile content) of an MEK solution (having a non-volatile content of 50% by mass) of dehydroabietic acid (molecular weight: 300.44, functional group equivalent of acidic site: 300 g/eq., manufactured by Wako Pure Chemical Industries Ltd.) used as a compound (C); 166.7 parts by mass (corresponding to 100 parts by mass in terms of a non-volatile content) of slurry silica (SC-1050MLQ, average particle size: 0.3 μm, non-volatile content: 60% by mass, manufactured by Admatechs Company Limited) used as an inorganic filler (D); 10 parts by mass of an acrylic polymer (ARUFON US-6170, manufactured by Toagosei Co., Ltd., Mw: 3000) used as a flexibility-imparting component (E); and 1 part by mass (corresponding to 0.1 parts by mass in terms of a non-volatile content) of an MEK solution (having a non-volatile content of 10% by mass) of 2-ethyl-4-methylimidazole (2E4MZ, manufactured by Shikoku Chemicals Corporation) used as a curing accelerator. The thus obtained varnish was applied onto a polyethylene terephthalate film (TR1-38, manufactured by Unitika Ltd.) having a thickness of 38 μm and having a surface coated with a release agent, and the resultant was dried by heating at 100° C. for 5 minutes to obtain a resin laminate including a resin composition layer of the present invention having a thickness of 30 μm. Here, a content of the compound (B) was 1.1% by mass based on a total content of the maleimide compounds (A).

Example 2

A varnish was prepared in the same manner as in Example 1 except that the use amount of the compound (B) of trimethoxy[3-(phenylamino)propyl]silane (KBM-573) was changed from 1 part by mass to 3 parts by mass, and a resin laminate was obtained. Here, the content of the compound (B) was 3.3% by mass based on the maleimide compounds (A).

Example 3

A varnish was prepared in the same manner as in Example 1 except that the use amount of the compound (B) of trimethoxy[3-(phenylamino)propyl]silane (KBM-573) was changed from 1 part by mass to 5 parts by mass, and a resin laminate was obtained. Here, the content of the compound (B) was 5.6% by mass based on the maleimide compounds (A).

Example 4

A varnish was prepared in the same manner as in Example 3 except that the use amount of the MEK solution (having a non-volatile content of 50% by mass) of the first maleimide compound (A) of the maleimide compound (BMI-2300) of formula (1) in which $R^1$ all represents a hydrogen atom and $n^1$ represents 1 to 3 was changed from 26 parts by mass (corresponding to 13 parts by mass in terms of a non-volatile content) to 39 parts by mass (corresponding to 19.5 parts by mass in terms of a non-volatile content), and that the third maleimide compound (A) was changed from 52 parts by mass (corresponding to 26 parts by mass in terms of a non-volatile content) of the MEK solution (having a non-volatile content of 50% by mass) of bis-(3-ethyl-5-methyl-maleimidophenyl)methane (BMI-70, manufactured by Chemical Industry Co., Ltd.) to 39 parts by mass (corresponding to 19.5 parts by mass in terms of a non-volatile content) of the MEK solution (having a non-volatile content of 50% by mass) of bis(3-ethyl-5-methyl-4-maleimidophenyl)methane (BMI-70), and a resin laminate was obtained. Here, the content of the compound (B) was 5.6% by mass based on the total content of the maleimide compounds (A).

Example 5

A varnish was prepared in the same manner as in Example 3 except that the use amount of the MEK solution (having a non-volatile content of 50% by mass) of the first maleimide compound (A) of the maleimide compound (BMI-2300) of formula (1) in which $R^1$ all represents a hydrogen atom and $n^1$ represents 1 to 3 was changed from 26 parts by mass (corresponding to 13 parts by mass in terms of a non-volatile content) to 52 parts by mass (corresponding to 26 parts by mass in terms of a non-volatile content), and that the third maleimide compound (A) was changed from 52 parts by mass (corresponding to 26 parts by mass in terms of a non-volatile content) of the MEK solution (having a non-volatile content of 50% by mass) of bis-(3-ethyl-5-methyl-maleimidophenyl)methane (BMI-70, manufactured by K•I Chemical Industry Co., Ltd.) to 26 parts by mass (corresponding to 13 parts by mass in terms of a non-volatile content) of the MEK solution (having a non-volatile content of 50% by mass) of bis(3-ethyl-5-methyl-4-maleimidophenyl)methane (BMI-70), and a resin laminate was obtained. Here, the content of the compound (B) was 5.6% by mass based on the total content of the maleimide compounds (A).

Example 6

A varnish was prepared in the same manner as in Example 3 except that the compound (C) of the MEK solution of dehydroabietic acid was not used, and a resin laminate was obtained. Here, the content of the compound (B) was 5.6% by mass based on the maleimide compounds (A).

Example 7

A varnish was prepared in the same manner as in Example 3 except that the flexibility-imparting component (E) of the acrylic polymer (US-6170) was not used, that the use amount of the MEK solution (having a non-volatile content of 50% by mass) of the maleimide compound (A) of the maleimide compound (BMI-2300) of formula (1) in which $R^1$ all represents a hydrogen atom and $n^1$ represents 1 to 3 was changed to 28.8 parts by mass (corresponding to 14.4 parts by mass in terms of a non-volatile content), that the second maleimide compound (A) was changed to 55.6 parts by mass (corresponding to 27.8 parts by mass in terms of a non-volatile content) of an MEK solution (having a non-volatile content of 50% by mass) of the maleimide compound of formula (2) (BMI-1000P), that the third maleimide compound (A) was changed to 57.8 parts by mass (corresponding to 28.9 parts by mass in terms of a non-volatile content) of an MEK solution (having a non-volatile content of 50% by mass) of bis(3-ethyl-5-methyl-4-maleimidophenyl)methane (BMI-70), and that the fourth maleimide compound (A) was changed to 57.8 parts by mass (corresponding to 28.9 parts by mass in terms of a non-volatile content) of an MEK solution (having a non-volatile content of 50% by mass) of 2,2-bis{4-(4-maleimidophenoxy)phenyl}propane (BMI-80), and a resin laminate was obtained. Here, the content of the compound (B) was 5.0% by mass based on the maleimide compounds (A).

Example 8

A varnish was prepared in the same manner as in Example 3 except that 40 parts by mass (corresponding to 20 parts by mass in terms of a non-volatile content) of an MEK solution (having a non-volatile content of 50% by mass) of dihydroabietic acid (molecular weight: 300.47, functional group equivalent of acidic site: 300 g/eq., manufactured by Wako Pure Chemical Industries Ltd.) was used as the compound (C) instead of the MEK solution of dehydroabietic acid, and a resin laminate was obtained. Here, the content of the compound (B) was 5.6% by mass based on the maleimide compounds (A).

Example 9

A varnish was prepared in the same manner as in Example 3 except that 40 parts by mass (corresponding to 20 parts by mass in terms of a non-volatile content) of an MEK solution (having a non-volatile content of 50% by mass) of an acid modified rosin resin (Malkyd No. 32, weight average molecular weight: 2000, functional group equivalent of acidic site: 414 g/eq., manufactured by Arakawa Chemical Industries, Ltd.) was used as the compound (C) instead of the MEK solution of dehydroabietic acid, and a resin laminate was obtained. Here, the content of the compound (B) was 5.6% by mass based on the maleimide compounds (A).

Comparative Example 1

A varnish was prepared in the same manner as in Example 1 except that the compound (B) of trimethoxy[3-(phenylamino)propyl]silane (KBM-573, manufactured by Shin-Etsh Chemical Co., Ltd.) was not used, and that the curing accelerator was changed from 1 part by mass (corresponding to 0.1 parts by mass in terms of a non-volatile content) of the MEK solution (having a non-volatile content of 10% by mass) of 2-ethyl-4-methylimidazole (2E4MZ, manufactured by Shikoku Chemicals Corporation) to 0.1 parts by mass (corresponding to 0.01 parts by mass in terms of a non-volatile content) of an MEK solution (having a non-volatile content of 10% by mass) of 2-phenyl-4-methylimidazole (2P4MZ, manufactured by Shikoku Chemicals Corporation), and a resin laminate was obtained.

Comparative Example 2

A varnish was prepared in the same manner as in Comparative Example 1 except that 5 parts by mass of 3-aminopropyltrimethoxysilane (KBM-903, manufactured by Shin-Etsu Chemical Co., Ltd.) was further added as a monoamino compound having a primary amino group, and a resin laminate was obtained.

Comparative Example 3

A varnish was prepared in the same manner as in Comparative Example 1 except that 5 parts by mass of vinyltrimethoxysilane (KBM-1003, manufactured by Shin-Etsu Chemical Co., Ltd.) was further added, and a resin laminate was obtained.

Comparative Example 4

A varnish was prepared in the same manner as in Comparative Example 1 except that 5 parts by mass of trimethoxyphenylsilane (KBM-103, manufactured by Shin-Etsu Chemical Co., Ltd.) was further added, and a resin laminate was obtained.

Comparative Example 5

A varnish was prepared in the same manner as in Example 1 except that the compound (B) of trimethoxy[3-(phenylamino)propyl]silane (KBM-573, manufactured by Shin-Etsu Chemical Co., Ltd.) was not used, and a resin laminate was obtained.

2. Evaluation of Resin Composition (1) Melt Viscosity (Pa·s)

The resin composition layer alone was peeled off from each of the resin laminates obtained in Examples 1 to 9 and Comparative Examples 1 to 5, and was crushed, and the thus obtained resin powder was weighed in an amount of 1 g to prepare a tablet with a diameter of 25 mm using a tablet shaper (Hand Press SSP-10A, manufactured by Shimadzu Corporation). The thus prepared tablet was measured for a melt viscosity by a parallel plate method using a rheometer (ARES-G2, manufactured by TA Instruments, Inc.). In detail, the melt viscosity was measured under conditions of an angular frequency of 10 rad/s, a strain of 0.1%, and a programming rate of 10° C./min in a range of 40° C. to 250° C., and a minimum value of the viscosity thus obtained in a range of 80° C. to 100° C. was defined as a minimum melt viscosity.

(2) Adhesion to Chip

The adhesion to a chip was evaluated in accordance with JIS K5600-5-6. Specifically, a resin composition layer-equipped chip was obtained by laminating each of the resin laminates obtained in Examples 1 to 9 and Comparative Examples 1 to 5 to a chip diced into a size of 4 cm×4 cm by using a vacuum pressure laminator. The thus obtained resin composition layer-equipped chip was heated using an oven at 200° C. for 3 hours. After cooling the resultant to room temperature, a right angle lattice pattern including 25 squares was formed by making six cuts each vertically and laterally at an interval of 1 mm in the resin composition layer-equipped chip. The thus cut resin composition layer-equipped chip was treated using a pressure cooker (temperature: 121° C., humidity: 100% RH, pressure: 2 atm) up to 96 hours, and thereafter, the resultant was subjected to a peeling test using a transparent adhesive tape under room temperature environment.

As a result of the peeling test, one having no peeling was shown as A, one having peeling in an extremely small portion alone was shown as B, and one having large peeling was shown as C.

(3) Flux Activity

The varnish obtained in each of Examples 1 to 9 and Comparative Examples 1 to 5 was applied onto a glossy surface of an electrolytic copper foil (3EC-III, manufactured by Mitsui Mining & Smelting Co., Ltd.) having a thickness of 12 μm, and the resultant was dried at 100° C. for 5 minutes to obtain a resin composition layer-equipped copper foil. A solder ball (Ecosolder® ball M705, Sn-3.0 Ag-0.5 Cu alloy, manufactured by Senju Metal Industry Co., Ltd.) having a diameter of 0.5 mm was placed on the resin composition layer-equipped copper foil, and an electrolytic copper foil (3EC-III) having a thickness of 12 μm was further placed thereon with the glossy surfaces opposing each other. The resultant was placed on a hot plate heated to 235° C. to melt the solder on the copper foil, and the flux activity was evaluated based on a wettability of the solder ball on the copper foil. The wettability of the solder ball was calculated based on a height (a) of the solder ball before heating and a height (b) of the solder ball after heating in accordance with the following expression:

Wettability of Solder Ball=$\{(a)-(b)\}/(a) \times 100$

One having a wettability of the solder ball of 50% or more was shown as A, one having a wettability of 25% or more and less than 50% was shown as B, and one having a wettability less than 25% was shown as C.

(4) Flexibility

The resin laminate obtained in each of Examples 1 to 9 and Comparative Examples 1 to 5 was cut into a shape of a strip having a size of 5 cm×10 cm, and the resultant was subjected to a heat treatment using an oven at 150° C. for 90 minutes. The thus heated resin laminate was cooled to room temperature, and was then bent with the polyethylene terephthalate film of the supporting material inside until the rear surfaces came into contact with each other. After this operation, it was checked whether or not the resin composition layer of the present embodiment had a crack for evaluating the flexibility. One having no cracks was shown as A, and one having some cracks was shown as C.

TABLE 1

| | | Example 1 | Example 2 | Example 3 | Example 4 | Example 5 | Example 6 | Example 7 | Example 8 |
|---|---|---|---|---|---|---|---|---|---|
| Varnish gel time [sec] | Automatic Gel Time Tester | 700 | 750 | 999 | 800 | 600 | — | — | 999 |
| Minimum Melt Viscosity [Pa · s] | Rheometer | 130 | <100 | <100 | <100 | <100 | — | — | <100 |
| Adhesion to Chip | Cross-cut Test | B | A | A | — | — | — | — | A |
| Flexibility | | A | A | A | — | — | A | C | A |
| Flux Activity | | A | A | A | — | — | C | — | A |

TABLE 1-continued

|  |  | Example 9 | Comparative Example 1 | Comparative Example 2 | Comparative Example 3 | Comparative Example 4 | Comparative Example 5 |
|---|---|---|---|---|---|---|---|
| Varnish gel time [sec] | Automatic Gel Time Tester | — | 350 | 50 | 350 | 350 | 330 |
| Minimum Melt Viscosity [Pa · s] | Rheometer | — | 130 | 300 | 200 | 250 | 150 |
| Adhesion to Chip | Cross-cut Test | — | C | C | C | C | C |
| Flexibility |  | A | A | A | A | A | A |
| Flux Activity |  | A | — | — | — | — | — |

INDUSTRIAL APPLICABILITY

A resin composition of the present embodiment exhibits various effects of being excellent in the adhesion to a chip, the flux activity, the flexibility and the low thermal expansion, and hence is useful as an underfill material, preferably as a pre-applied underfill material. Since the resin composition of the present embodiment is particularly excellent in the adhesion to a chip, adhesion to chip that can stand long term use under a use environment can be imparted to a laminate obtained by bonding a chip and a substrate, bonding a chip and a semiconductor wafer, or a chip and another chip, and the resin composition is thus extremely useful.

The invention claimed is:

1. A resin composition for an underfill material, comprising a maleimide compound (A) and a secondary monoamino compound (B), wherein the maleimide compound (A) comprises a maleimide compound represented by the following formula (2):

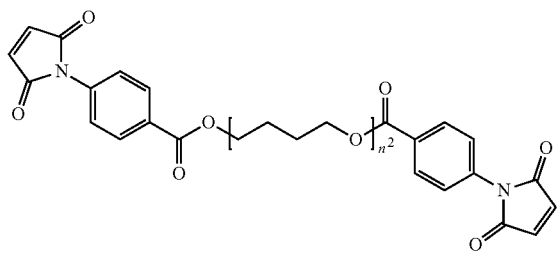

(2)

wherein $n^2$ represents an integer of 1 or more and 30 or less, and wherein the secondary monoamino compound (B) has a boiling point of 120° C. or more.

2. The resin composition according to claim 1, wherein the maleimide compound (A) further comprises at least one selected from the group consisting of 2,2-bis{4-(4-maleimidophenoxy)phenyl}propane, 1,2-bis(maleimido)ethane, 1,4-bis(maleimido)butane, 1,6-bis(maleimido)hexane, N,N'-1,3-phenylenedimaleimide, N,N'-1,4-phenylenedimaleimide, N-phenylmaleimide, a maleimide compound represented by the following formula (1), and a maleimide compound represented by the following formula (3):

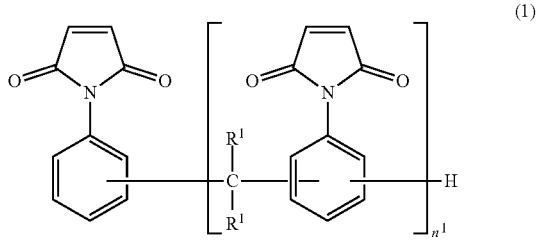

(1)

wherein $R^1$ each independently represents a hydrogen atom or a methyl group, and $n^1$ represents an integer of 1 or more;

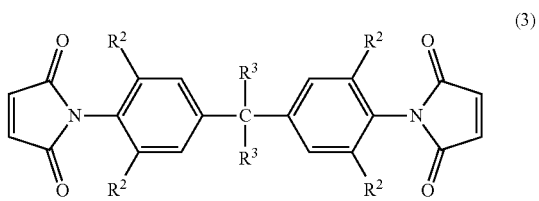

(3)

wherein $R^2$ each independently represents a hydrogen atom, a methyl group or an ethyl group, and $R^3$ each independently represents a hydrogen atom or a methyl group.

3. The resin composition according to claim 1, wherein the maleimide compound (A) further comprises at least one selected from the group consisting of 2,2-bis{4-(4-maleimidophenoxy)phenyl}propane, the maleimide compound represented by formula (1), and the maleimide compound represented by formula (3):

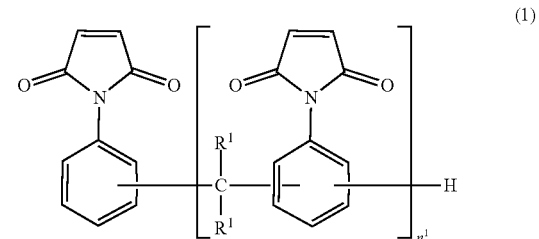

(1)

wherein $R^1$ each independently represents a hydrogen atom or a methyl group, and $n^1$ represents an integer of 1 or more;

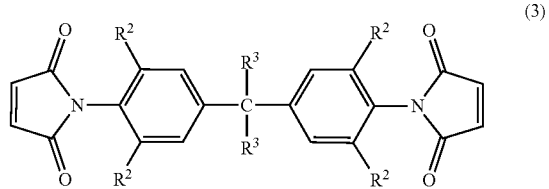

wherein R² each independently represents a hydrogen atom, a methyl group or an ethyl group, and R³ each independently represents a hydrogen atom or a methyl group.

4. The resin composition according to claim 1, wherein the secondary monoamino compound (B) comprises at least one selected from the group consisting of bis(2-methoxyethyl)amine, bis(2-ethoxyethyl)amine, bis(4-biphenylyl)amine, bis(3-biphenylyl)amine, Bindschedler's Green Leuco base, 2-acetamidoethanol, acetamidomethanol, 1-acetamidonaphthalene, bis(4-tert-butylphenyl)amine and a compound represented by the following formula (4):

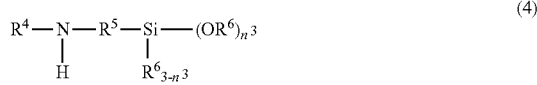

wherein $R^4$ represents an aryl group, an aralkyl group, an alkyl group or a cycloalkyl group, $R^5$ represents an alkylene group, $R^6$ each independently represents an alkyl group, and $n^3$ represents an integer of 1 to 3.

5. The resin composition according to claim 4, wherein the compound (B) comprises the compound represented by formula (4).

6. The resin composition according to claim 5, wherein the compound (B) is trimethoxy[3-(phenylamino)propyl]silane and/or [3-(cyclohexylamino)propyl]trimethoxysilane.

7. The resin composition according to claim 1, wherein a content of the compound (B) is 0.5 to 30% by mass based on a total content of the maleimide compound (A).

8. The resin composition according to claim 1, further comprising an organic compound (C) having an acidic site.

9. The resin composition according to claim 8, wherein the compound (C) comprises at least one selected from the group consisting of abietic acid, neoabietic acid, dehydroabietic acid, pimaric acid, isopimaric acid, palustric acid, diphenolic acid, dihydroabietic acid, tetrahydroabietic acid, and an acid-modified rosin resin.

10. The resin composition according to claim 1, further comprising an inorganic filler (D).

11. The resin composition according to claim 10, wherein the inorganic filler (D) comprises at least one selected from the group consisting of silica, aluminum hydroxide, alumina, boehmite, boron nitride, aluminum nitride, magnesium oxide and magnesium hydroxide.

12. The resin composition according to claim 11, wherein the inorganic filler (D) comprises silica.

13. The resin composition according to claim 1, further comprising a flexibility-imparting component (E).

14. The resin composition according to claim 13, wherein the flexibility-imparting component (E) comprises an acrylic oligomer and/or an acrylic polymer.

15. The resin composition according to claim 1, comprising a pre-applied underfill material.

16. A laminate, comprising: a supporting material; and a layer comprising the resin composition according to claim 1 stacked on the supporting material.

17. A semiconductor wafer with a resin composition layer, comprising: a semiconductor wafer; and the layer comprising the resin composition of the laminate according to claim 16 stacked on the semiconductor wafer.

18. A substrate for mounting a semiconductor with a resin composition layer, comprising: a substrate for mounting a semiconductor; and the layer comprising the resin composition of the laminate according to claim 16 stacked on the substrate for mounting the semiconductor.

19. A semiconductor device, comprising: the semiconductor wafer with a resin composition layer according to claim 17.

* * * * *